United States Patent [19]

Ikuta et al.

[11] Patent Number: 5,781,141

[45] Date of Patent: Jul. 14, 1998

[54] DIGITAL-TO-ANALOG CONVERTER AND SENSOR-CHARACTERISTIC ADJUSTMENT CIRCUIT

[75] Inventors: Toshio Ikuta, Handa; Seiichirou Otake, Hazu-gun, both of Japan

[73] Assignee: Denso Corporation, Kariya, Japan

[21] Appl. No.: 733,741

[22] Filed: Oct. 18, 1996

[30] Foreign Application Priority Data

Oct. 20, 1995 [JP] Japan .................................. 7-272474

[51] Int. Cl.⁶ .................................................... H03M 1/00
[52] U.S. Cl. .......................... 341/154; 327/407; 341/120
[58] Field of Search ........................... 341/154, 144, 341/172, 118, 120; 327/407

[56] References Cited

U.S. PATENT DOCUMENTS 4,542,368   9/1985   Lillis .................................... 341/154

Primary Examiner—Jeffrey A. Gaffin
Assistant Examiner—Peguy Jean Pierre
Attorney, Agent, or Firm—Cushman Darby & Cushman IP Group of Pillsbury Madison & Sutro LLP

[57] ABSTRACT

A digital-to-analog converter includes an R-2R resistive ladder network having resistors connected in a ladder form in correspondence with a number of bits of a digital input signal. The R-2R resistive ladder network has an output terminal. A pair of positive and negative dc-power-supply terminals are connected to the R-2R resistive ladder network. Currents flowing between the R-2R resistive ladder network and one of the positive and negative dc-power-supply terminals are controlled in response to the bits of the digital input signal to generate an analog voltage signal at the output terminal of the R-2R resistive ladder network. The analog voltage signal depends on the digital input signal. A first resistor and a second resistor located outside the R-2R resistive ladder network are connected in series between the positive and negative dc-power-supply terminals. A third resistor located outside the R-2R resistive ladder network is connected between the output terminal of the R-2R resistive ladder network and the second resistor located outside the R-2R resistive ladder network. A conversion output terminal is connected to a junction between the second and third resistors located outside the R-2R resistive ladder network.

8 Claims, 7 Drawing Sheets

DIGITAL-TO-ANALOG CONVERTER AND SENSOR-CHARACTERISTIC ADJUSTMENT CIRCUIT

BACKGROUND OF THE INVENTION

1. Field of the Invention

This invention relates to a digital-to-analog (D/A) converter having an R-2R resistive ladder network driven by constant currents. This invention also relates to a sensor-characteristic adjustment circuit that includes a D/A converter.

2. Description of the Prior Art

Some digital-to-analog (D/A) converters have an R-2R resistive ladder network driven by constant currents. In such a D/A converter, switches are connected between the nodes of the resistive ladder network and constant-current sources respectively. The switches are closed and opened in response to the bits of a digital input signal. There occurs an analog output voltage at an end of the resistive ladder network that depends on the digital input signal.

SUMMARY OF THE INVENTION

It is an object of this invention to provide an improved digital-to-analog (D/A) converter.

It is another object of this invention to provide an improved sensor-characteristic adjustment circuit.

A first aspect of this invention provides a digital-to-analog converter that has an R-2R resistive ladder network with resistors connected in a ladder form in correspondence with a number of bits of a digital input signal. The R-2R resistive ladder network has an output terminal. A positive and a negative, dc-power-supply terminal and coupled to the R-2R resistive ladder network. Circuitry is included for controlling the current flowing between the R-2R resistive ladder network and one of the positive and negative dc-power-supply terminals in response to the bits of the digital input signal so as to generate an analog voltage signal at the output terminal of the R-2R resistive ladder network. The analog voltage signal thus depends on the digital input signal. A first resistor and a second resistor are coupled outside the R-2R resistive ladder network and are connected in series between the positive and negative dc-power-supply terminal. A third resister is coupled outside the R-2R resistive ladder network and is connected between the output terminal of the R-2R resistive ladder network and the second resistor. A conversion output terminal is coupled to a junction between the second and third resistor.

A second aspect of this invention provides a digital-to-analog converter that has an R-2R resistive ladder network with resistors coupled in a ladder form in correspondence with a number of bits of a digital input signal. The R-2R resistive ladder network has an output terminal. A positive and a negative dc-power-supply terminal are coupled to the R-2R resistive ladder network. Circuitry is included for controlling the current flowing between the R-2R resistive ladder network and one of the positive and negative dc-power-supply terminals in response to the bits of the digital input signal so as to generate an analog voltage signal at the output terminal of the R-2R resistive ladder network. The analog voltage signal thus depends on the digital input signal. A series combination of a first resistor and a second resistor are coupled outside the R-2R resistive ladder network. The series combination or first and second resistors are coupled between the positive and negative dc-power-supply terminal. A third resistor is coupled outside the R-2R resistive ladder network and is coupled between the output terminal of the R-2R resistive ladder network and a junction between the first and second resistors. A conversion output terminal is coupled to the junction between the first and second resistor.

A third aspect of this invention is based on the first aspect thereof, and provides a digital-to-analog converter that further includes constant-current sources coupled between the R-2R resistive ladder network and one of the positive and negative dc-power-supply terminals.

A fourth aspect of this invention is based on the second aspect thereof, and provides a digital-to-analog converter wherein the controlling circuitry includes constant-current sources. Diodes are coupled between the constant-current sources and the R-2R resistive ladder network. Circuitry is also provided and means for controlling voltages at junctions between the constant-current sources and the diode in response to the bits of the digital input signal.

A fifth aspect of this invention provides a digital-to-analog converter that has an R-2R resistive ladder network with resistors connected in a ladder form in correspondence with a number of bits of a digital input signal. The R-2R resistive ladder network has an output terminal. A positive and a negative dc-power-supply terminal are coupled to the R-2R resistive ladder network Circuitry is included for controlling currents flowing between the R-2R resistive ladder network and one of the positive and negative dc-power-supply terminals in response to the bits of the digital input signal so as to generate an analog voltage signal at the output terminal of the R-2R resistive ladder network. The analog voltage signal thus depends on the digital input signal. A series combination of a first resistor, a second resistor, and a third resistor is coupled outside the R-2R resistive ladder network. This series combination is coupled between the positive and negative dc-power-supply terminal. A junction between the first and second resistors is coupled to the output terminal of the R-2R resistive ladder network. A conversion output terminal is coupled to a junction between the second and third resistors.

A sixth aspect of this invention provides a circuit for adjusting the characteristics of a sensor. The circuit has a digital-to-analog converter that converts a digital reference signal into an analog reference signal. Circuitry is included for adjusting an output signal of the sensor in response to the analog reference signal generated by the digital-to-analog converter. The digital-to-analog converter includes an R-2R resistive ladder network with resistors coupled in a ladder form in correspondence with a number of bits of the digital reference signal. The R-2R resistive ladder network includes an output terminal. A positive and a negative dc-power-supply terminal connected to the R-2R resistive ladder network. Circuitry is included for controlling the current flowing between the R-2R resistive ladder network and one of the positive and negative dc-power-supply terminals in response to the bits of the digital reference signal so as to generate an analog voltage signal at the output terminal of the R-2R resistive ladder network. The analog voltage signal thus depends on the digital reference signal. A first resistor and a second resistor located outside the R-2R resistive ladder network are coupled in series between the positive and negative dc-power-supply terminals. A third resistor located outside the R-2R resistive ladder network is coupled between the output terminal of the R-2R resistive ladder network and the second resistor. A conversion output terminal is coupled to a junction between the second and third resistors. The analog references signal appears at the conversion output terminal.

A seventh aspect of this invention is based on the sixth aspect thereof, and provides a circuit that further includes a memory that stores the digital reference signal.

DESCRIPTION OF THE PREFERRED EMBODIMENTS

A prior digital-to-analog (D/A) converter will be explained for a better understanding of this invention.

Figure 1:
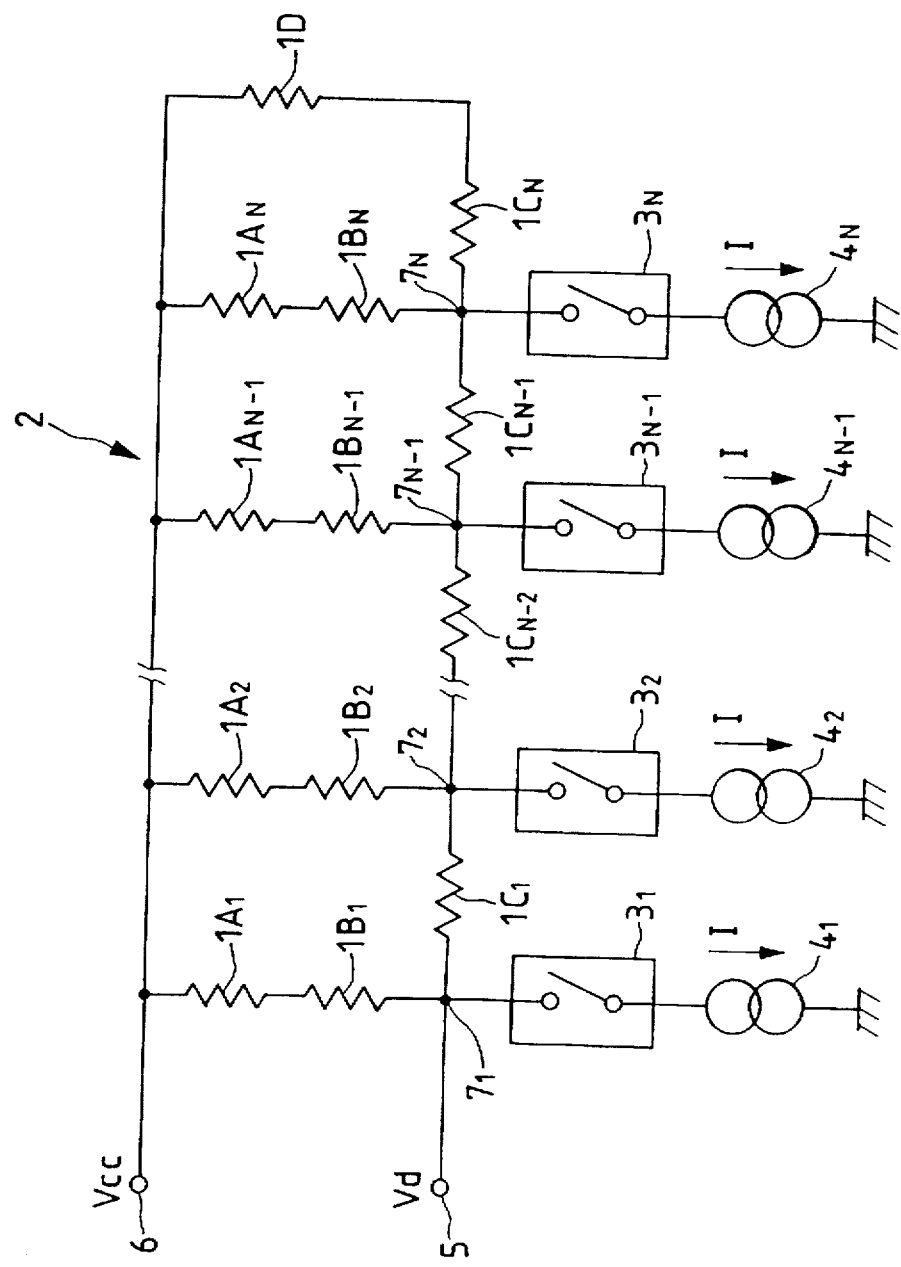
FIG. 1 is a diagram of a prior-art D/A converter.

FIG. 1 shows a prior D/A converter including an R-2R resistive ladder network 2. The resistive ladder network 2 has resistors $1A_1$, $1A_2$, . . . , $1A_{N-1}$, $1A_N$, resistors $1B_1$, $1B_2$, . . . , $1B_{N-1}$, $1B_N$, resistors $1C_1$, $1C_2$, . . . , $1C_{N-1}$, $1C_N$, and a resistor 1D, where "N" denotes a given natural number. The resistors $1A_1$, $1A_2$, . . . , $1A_{N-1}$, $1A_N$, the resistors $1B_1$, $1B_2$, . . . , $1B_{N-1}$, $1B_N$, the resistors $1C_1$, $1C_2$, . . . , $1C_{N-1}$, $1C_N$, and the resistor 1D are identical. Thus, the resistances of the resistors $1A_1$, $1A_2$, . . . , $1A_{N-1}$, $1A_N$, the resistances of the resistors $1B_1$, $1B_2$, . . . , $1B_{N-1}$, $1B_N$, the resistances of the resistors $1C_1$, $1C_2$, . . . , $1C_{N-1}$, $1C_N$, and the resistance of the resistor 1D are equal to a given value R.

The resistors $1A_1$ and $1B_1$ are connected in series. The resistors $1A_2$ and $1B_2$ are connected in series. Similarly, the resistors $1A_3$, $1A_4$, . . . , $1A_{n-2}$, and the resistors $1B_3$, $1B_4$, . . . , $1B_{N-2}$ are connected. The resistors $1A_{N-1}$ and $1B_{N-1}$ are connected in series. The resistors $1A_N$ and $1B_N$ are connected in series. First ends of the series combination of the resistors $1A_1$ and $1B_1$, the series combination of the resistors $1A_2$ and $1B_2$, . . . , the series combination of the resistors $1A_{N-1}$ and $1B_{N-1}$, and the series combination of the resistors $1A_N$ and $1B_N$ are connected in common to a power supply terminal 6 which leads from the positive terminal of a dc power supply (not shown). The dc power supply generates a given voltage Vcc equal to, for example, 5 V. The negative terminal of the dc power supply is grounded. The resistors $1C_1$, $1C_2$, . . . , $1C_{N-1}$ are sequentially connected between the second ends of the series combination of the resistors $1A_1$ and $1B_1$, the series combination of the resistors $1A_2$ and $1B_2$, . . . , the series combination of the resistors $1A_{N-1}$ and $1B_{N-1}$, and the series combination of the resistors $1A_N$ and $1B_N$. A first end of the resistor 1D is connected to the power supply terminal 6. A second end of the resistor 1D is connected to a first end of the resistor $1C_N$. A second end of the resistor $1C_N$ is connected to the junction between the resistors $1B_N$ and the resistor $1C_{N-1}$.

The resistive ladder network 2 has nodes $7_1$, $7_2$, . . . , $7_{N-1}$, and $7_N$ which are located at the junction between the resistors $1B_1$ and $1C_1$, the junction between the resistors $1B_2$ and $1C_2$, . . . , the junction between the resistors $1B_{N-1}$ and $1C_{N-1}$, and the junction between the resistors $1B_N$ and $1C_N$, respectively. The first node $7_1$ is connected to an output terminal 5. The first node $7_1$ is grounded via a series combination of a switch $3_1$ and a constant-current source (a current regulator) $4_1$. The second node $7_2$ is grounded via a series combination of a switch $3_2$ and a constant-current source (a current regulator) $4_2$. The third and later nodes $7_3$, $7_4$, . . . , and $7_{N-2}$ are grounded via a series combination of a switch $3_3$ and a constant-current source (a current regulator) $4_3$, a series combination of a switch $3_4$ and a constant-current source (a current regulator) $4_4$, . . . , and a series combination of a switch $3_{N-2}$ and a constant-current source (a current regulator) $4_{N-2}$, respectively.

The node $7_{N-1}$ is grounded via a series combination of a switch $3_{N-1}$ and a constant-current source (a current regulator) $4_{N-1}$.

The last node $7_N$ is grounded via a series combination of a switch $3_N$ and a constant-current source (a current regulator) $4_N$.

The switches $3_1$, $3_2$, . . . , $3_{N-1}$ and $3_N$ have control terminals subjected to the bits of a digital input signal respectively.

The switches $3_1$, $3_2$, . . . , $3_{N-1}$, and $3_N$ are sequentially assigned to the MSB (the highest bit) to the LSB (the lowest bit) of the digital input signal, respectively. Each of the switches $3_1$, $3_2$, . . . $3_{N-1}$ and $3_N$ is changed between a closed state (an on state) and an open state (an off state) in response to the corresponding bit of the digital input signal.

The constant-current sources $4_1$, $4_2$, $3_{N-1}$ and $3_N$ are identical. Thus, the currents flowing through the respective constant-current sources $4_1$, $4_2$, $3_{N-1}$, and $3_N$ are equal to a given value I.

In the prior-art D/A converter of FIG. 1, an analog output voltage Vd which appears at the output terminal 5 is expressed as follows.

$$Vd = Vcc - IR \sum_{i=0}^{N-1} \left(\frac{1}{2}\right)^{N-1} \cdot Si \qquad (1)$$

where Si denotes "0" or "1" represented by each of the bits of the digital input signal.

A consideration is now given of the case where the analog output voltage Vd is variable in the range of 4.5 V ±32 mV, and the resolution corresponds to 2 mV and the power supply voltage Vcc is equal to 5 V. In this case, the analog output voltage Vd reaches the minimum value (4.468 V) when the following relation is satisfied.

$IR \times 2 \geq 0.532$ V

When all the bits of the digital input signal are "1" and the number N is relatively great, the coefficient with respect to the term IR in the equation (1) can be approximate to "2".

In the case where the resistance R is equal to 8 kΩ, the minimum current I is equal to 33.25 μA according to the above-indicated relation. The equation (1) indicates that the minimum resolution is determined by the LSB (the lowest bit) of the digital input signal. Accordingly, the resolution corresponding to 2 mV is available under the following condition.

$$2(mV)/IR = (2\,mV)/(8\,k\Omega \times 33.25\,\mu A)$$
$$= (1/2)^{7.055} < (1/2)^8$$

Thus, the resolution corresponding to 2 mV or less is available when the bit number (the number N) of the digital input signal is equal to "9".

As previously indicated, the analog output voltage Vd is variable in the range of 4.5 V ±32 mV. The size of this variation range is equal to 64 mV. When the resolution corresponds to 2 mV, the variation range is divided by 2-mV steps into 32 sub ranges since 64 mV/2 mV =32. The 32 sub ranges correspond to 5 bits of the digital input signal. Thus, a resolution of 2 mV corresponds to 5 bits of the digital input signal in theoretical view while a resolution of 2 mV corresponds to 9 bits of the digital input signal in a practical circuit due to the relation with the power supply voltage.

Accordingly, a practical circuit is provided with an additional arrangement related to 4 surplus bits of the digital input signal.

Therefore, an IC chip having the prior D/A converter of FIG. 1 tends to be great in chip area and chip size. The rate of electric power consumed by the prior D/A converter of FIG. 1 tends to be great since there are an increased number of constant-current sources corresponding to an increased bit number.

FIRST EMBODIMENT

Figure 2:
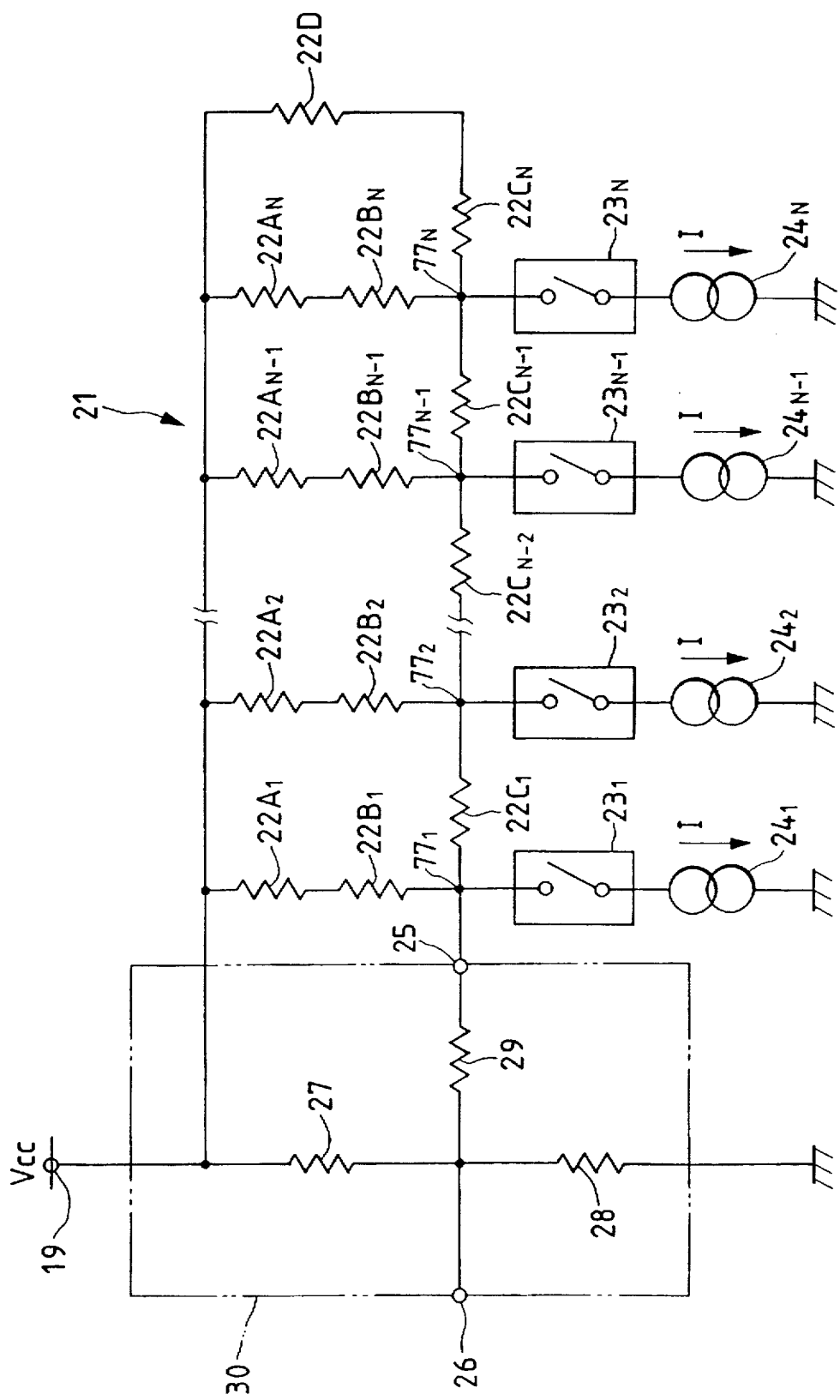
FIG. 2 is a diagram of a D/A converter according to a first embodiment of this invention.

With reference to FIG. 2, a digital-to-analog (D/A) converter includes an R-2R resistive ladder network 21. The resistive ladder network 21 has resistors $22A_1, 22A_2, \ldots, 22A_{N-1}, 22A_N$, resistors $22B_1, 22B_2, \ldots, 22B_{N-1}, 22B_N$, resistors $22C_1, 22C_2, \ldots, 22C_{N-1}, 22C_N$, and a resistor $22_D$, where "N" denotes a given natural number. The resistors $22A_1, 22A_2, \ldots, 22A_{N-1}, 22A_N$, the resistors $22B_1, 22B_2, \ldots, 22B_{N-1}, 22B_N$, the resistors $22C_1, 22C_2, \ldots, 22C_{N-1}, 22C_N$, and the resistor 22D are identical. Thus, the resistances of the resistors $22A_1, 22A_2, \ldots, 22A_{N-1}, 22A_N$, the resistances of the resistors $22B_1, 22B_2, \ldots, 22B_{N-1}, 22B_N$, the resistances of the resistors $22C_1, 22C, 22C_{N-1}, 22C_N$, and the resistance of the resistor 22D are equal to a given value R.

The resistors $22A_1$ and $22B_1$ are connected in series. The resistors $22A_2$ and $22B_2$ are connected in series. Similarly, the resistors $22A_3, 22A_4, \ldots, 22A_{N-2}$, and the resistors $22B_3, 22B_4, \ldots, 22B_{N-2}$ are connected. The resistors $22A_{N-1}$ and $22B_{N-1}$ are connected in series. The resistors $22A_N$ and $22B_N$ are connected in series. First ends of the series combination of the resistors $22A_1$ and $22B_1$, the series combination of the resistors $22A_2$ and $22B_2, \ldots$, the series combination of the resistors $22A_{N-1}$ and $22B_{N-1}$, and the series combination of the resistors $22A_N$ and $22B_N$ are connected in common to a power supply terminal 19 which leads from the positive terminal of a dc power supply (not shown). The dc power supply generates a given voltage Vcc equal to, for example, 5 V. The negative terminal of the dc power supply is grounded. The resistors $22C_1, 22C, \ldots, 22C_{N-1}$ are sequentially connected between second ends of the series combination of the resistors $22A_1$ and $22B_1$, the series combination of the resistors $22A_2$ and $22B_2, \ldots$, the series combination of the resistors $22A_{N-1}$ and $22B_{N-1}$, and the series combination of the resistors $22A_N$ and $22B_N$. A first end of the resistor 22D is connected to the power supply terminal 19. A second end of the resistor 22D is connected to a first end of the resistor $22C_N$. A second end of the resistor $22C_N$ is connected to the junction between the resistors $22B_N$ and the resistor $22C_{N-1}$.

The resistive ladder network 21 has nodes $77_1, 77_2, 77_{N-1}$, and $77_N$ which are located at the junction between the resistors $22B_1$ and $22C_1$, the junction between the resistors $22B_2$ and $22C_2, \ldots$, the junction between the resistors $22B_{N-1}$ and $22C_{N-1}$, and the junction between the resistors $22B_N$ and $22C_N$, respectively. The first node $77_1$ is connected to an inter-network terminal 25. The first node $77_1$ is grounded via a series combination of a switch $23_1$ and a constant-current source (a current regulator) $24_1$. The second node $77_2$ is grounded via a series combination of a switch $23_2$ and a constant-current source (a current regulator) $24_2$. The third and later nodes $77_3, 77_4, \ldots$ and $77_{N-2}$ are grounded via a series combination of a switch $23_3$ and a constant-current source (a current regulator) $24_3$, a series combination of a switch $23_4$ and a constant-current source (a current regulator) $24_4, \ldots$, and a series combination of a switch $23_{N-2}$ and a constant-current source (a current regulator) $24_{N-2}$, respectively. The node $77_{N-1}$ is grounded via a series combination of a switch $23_{N-1}$ and a constant-current source (a current regulator) $24_{N-1}$. The last node $77_N$ is grounded via a series combination of a switch $23_N$ and a constant-current source (a current regulator) $24_N$.

The switches $23_1, 23_2, \ldots, 23_{N-1}$ and $23_N$ have control terminals subjected to the bits of a digital input signal respectively.

The switches $23_1, 23_2, \ldots, 23_{N-1}$, and $23_N$ are sequentially assigned to the MSB (the highest bit) to the LSB (the lowest bit) of the digital input signal, respectively. Each of the switches $23_1, 23_2, \ldots, 23_{N-1}$, and $23_N$ is changed between a closed state (an on state) and an open state (an off state) in response to the corresponding bit of the digital input signal.

The constant-current sources $24_1, 24_2, 23_{N-1}$, and $23_N$ are identical. Thus, the currents flowing through the respective constant-current sources $24_1, 24_2, 23_{N-1}$, and $23_N$ are equal to a given value I.

The D/A converter of FIG. 2 includes a resistive network 30 connected to the resistive ladder network 21. The resistive network 30 has resistors 27, 28, and 29. A first end of the resistor 27 is connected to the power supply terminal 19. A first end of the resistor 28 is grounded. A first end of the resistor 29 is connected to the inter-network terminal 25. Second ends of the resistors 27, 28, and 29 are connected in common to an output terminal 26. The resistor 27 has a predetermined resistance RI. The resistor 28 has a predetermined resistance R2. The resistor 29 has a predetermined resistance R3.

Figure 3:
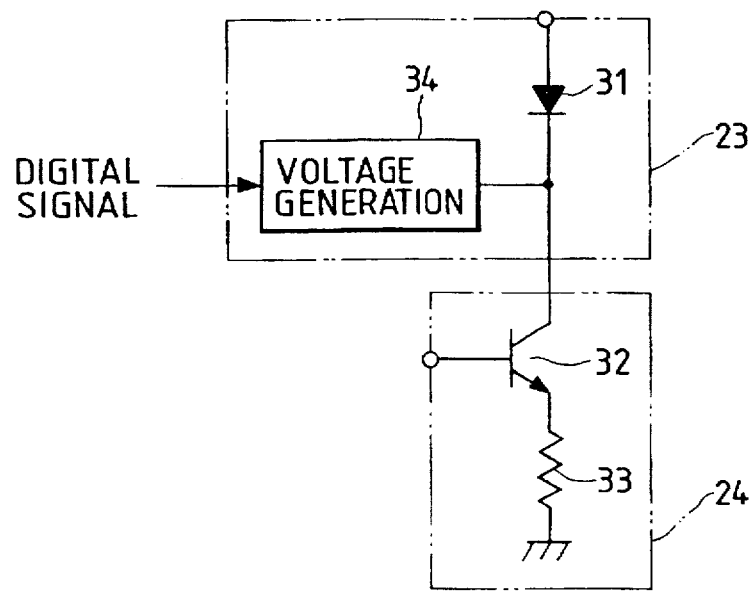
FIG. 3 is a diagram of a switch and a constant-current source in the D/A converter of FIG. 2.

FIG. 3 shows an example of a switch 23 corresponding to each of the switches $23_1, 23_2, \ldots, 23_{N-1}$, and $23_N$, and an example of a constant-current source 24 corresponding to each of the constant-current sources $24_1, 24_2, 23_{N-1}$, and $23_N$.

With reference to FIG. 3, the switch 23 includes a diode 31 and a signal voltage generation circuit 34. The constant-current source 24 includes an npn transistor 32 and a resistor 33. The anode of the diode 31 is connected to a related node in the resistive ladder network 21 (see FIG. 2). The cathode of the diode 31 is connected to the collector of the transistor 32. The output terminal of the signal voltage generation circuit 34 is connected to a junction between the cathode of the diode 31 and the collector of the transistor 32. The input terminal of the signal voltage generation circuit 34 is subjected to a related bit of the digital input signal. The emitter of the transistor 32 is grounded via the resistor 33.

The base of the transistor 32 is subjected to a given positive potential so that the given current I can flow through the collector-emitter path of the transistor 32.

The switch 23 is a kind of a diode switch. The signal voltage generation circuit 34 outputs a given high-level voltage or sets its output terminal in an open state in response to the logic state of the related bit of the digital input signal. When the signal voltage generation circuit 34 outputs the high-level voltage, the voltage at the cathode of the diode 31 is higher than the voltage at the anode thereof so that the flow of a current from the resistive ladder network 21 (see FIG. 2) to the constant-current source 24 via the switch 23 is blocked or inhibited. Accordingly, in this case, the switch 23 assumes an off state (an open state). When the signal voltage generation circuit 34 sets its output terminal in the open state, the flow of a current from the resistive ladder network 21 (see FIG. 2) to the constant-current source 24 via the switch 23 is allowed. Accordingly, in this case, the switch 23 assumes an on state (a closed state).

In the D/A converter of FIG. 2, an analog output voltage VD which appears at the output terminal 26 is expressed as follows.

$$VD = \frac{R1R2 + R2(R + R3)}{R1R2 + (R1 + R2)(R + R3)} \cdot Vcc - \frac{R1R2}{R1R2 + (R1 + R2)(R + R3)} \cdot IR \sum_{i=0}^{N} \left(\frac{1}{2}\right)^{N-1} \cdot Si \quad (2)$$

where Si denotes "0" or "1" represented by each of the bits of the digital input signal.

Figure 4:
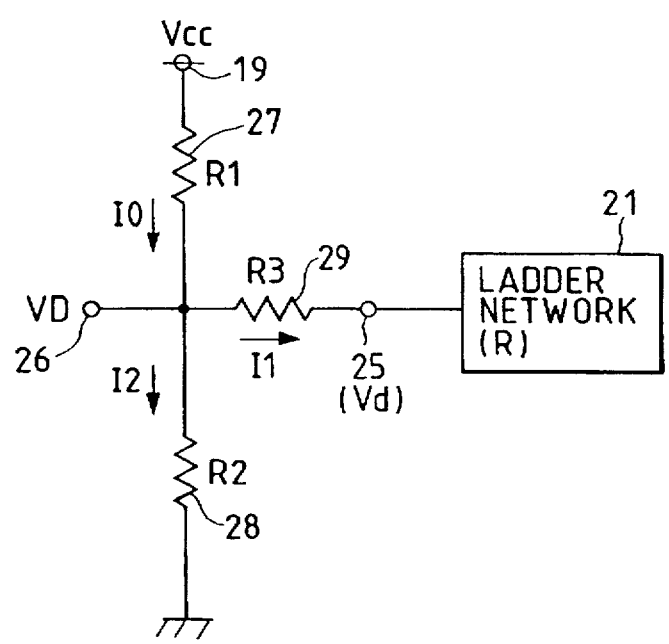
FIG. 4 is a diagram of a part of the D/A converter in FIG. 2.

With reference to FIG. 4, the resistance of the resistive ladder network 21 as viewed from the inter-network terminal 25 is equal to the given value R. If the resistive network 30 is not connected to the resistive ladder network 21, a voltage Vd appearing at the terminal 25 is equal to a value expressed in the equation (1). Accordingly, in the case where the resistive network 30 is connected to the resistive ladder network 21, the analog output voltage VD which appears at the output terminal 26 is given by referring to equations as follows.

$$VD = Vd + I1(R + R3) \quad (3)$$
$$I0 = I1 + I2 \quad (4)$$
$$I0 = \frac{Vcc - VD}{R1} \quad (5)$$
$$I2 = \frac{VD}{R2} \quad (6)$$

where "I0" denotes the current flowing through the resistor 27; "I1 denotes the current flowing through the resistor 29; and "I2" denotes the current flowing through the resistor 28.

The equations (4), (5), and (6) provide an equation (7) which expresses the current I1 as follows.

$$\begin{aligned} I1 &= I0 - I2 \\ &= \frac{Vcc - VD}{R1} - \frac{VD}{R2} \end{aligned} \quad (7)$$

The equation (3) provides an equation (8) which expresses the current I1 as follows.

$$I1 = \frac{VD - Vd}{R + R3} \quad (8)$$

Regarding the setting of a resolution and a range of the analog output voltage VD given by the equation (2), it is preferable to choose the resistances R1, R2, and R3 of the resistors 27, 28, and 29 as follows. The maximum value of the analog output voltage VD in its range is denoted by "VDmax", and the second term (including "Σ") in the right-hand side of the equation (2) is set to "0". These steps of operation result in a first simplified equation. The minimum value of the analog output voltage VD in its range is denoted by "VDmin", and the second term (including "Σ") in the right-hand side of the equation (2) is set to "2IR". These steps of operation result in a second simplified equation. There are three unknown numbers R1, R2, and R3 in the two simplified equations.

Thus, the resistances R1, R2, and R3 can not be uniquely determined by the two simplified equations. One of the resistances R1, R2, and R3 is suitably chosen in consideration of a consumed current. Then, the other resistances are determined by referring to the two simplified equations.

An example of the setting of the conditions is as follows. The power supply voltage Vcc is equal to 5 V. The analog output voltage VD is variable in the range of 4.5 V ±32 mV. The resolution corresponds to 2 mV. The resistance R is equal to 8 kΩ. The current value I is equal to 62.5 μA. The resistance R1 is equal to 2 kΩ. The resistance R2 is equal to 18 kΩ. The resistance R3 is equal to 16 kΩ. In this case, the D/A converter of FIG. 2 is suitable to a 5-bit digital input signal rather than a 9-bit digital input signal. Thus, the D/A converter of FIG. 2 can handle a digital input signal having a reduced number of bits. This is advantageous in decreasing a chip size when the D/A converter of FIG. 2 is formed as an IC chip.

Confirmation is made as follows. The above-indicated values of the resistances R, R1, R2, and R3, the above-indicated value of the power supply voltage Vcc, and the above-indicated value of the current I are placed in the equation (2). Thereby, the equation (2) changes into the following version.

$$VD = 4.53488 - 0.03101 \cdot \sum_{i=0}^{N} \left(\frac{1}{2}\right)^{N-1} \cdot Si$$

This equation shows that the analog output voltage VD is variable in the range of 4.5048 V ±30 mV, and that the resolution corresponds to 1.938 mV ($0.03101/2^4$). These confirmation values of the range and the resolution are approximately equal to the previously-indicated setting values thereof.

SECOND EMBODIMENT

Figure 5:
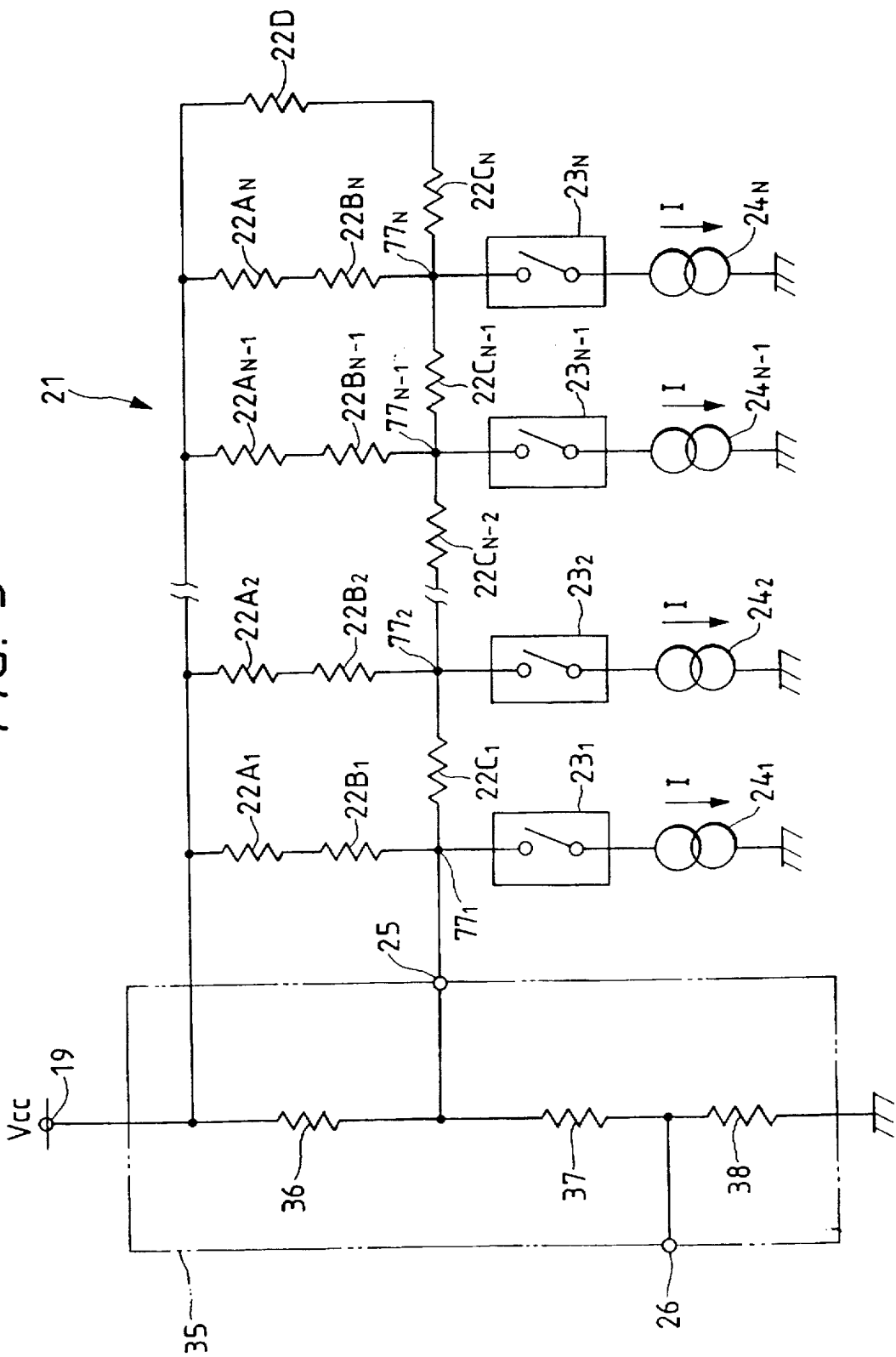
FIG. 5 is a diagram of a D/A converter according to a second embodiment of this invention.

FIG. 5 shows a D/A converter according to a second embodiment of this invention. The D/A converter of FIG. 5 is similar to the D/A converter of FIG. 2 except that a resistive network 35 replaces the resistive network 30 (see FIG. 2).

As shown in FIG. 5, the resistive network 35 includes resistors 36, 37, and 38 connected in series. A first end of the resistor 36 is connected to a power supply terminal 19 subjected to a given voltage Vcc. A second end of the resistor 36 is connected to a first end of the resistor 37. A second end of the resistor 37 is connected to a first end of the resistor 38. A second end of the resistor 38 is grounded. The junction between the resistors 36 and 37 is connected to an inter-network terminal 25. The junction between the resistors 37 and 38 is connected to an output terminal 26. The resistor 36 has a predetermined resistance R1. The resistor 37 has a predetermined resistance R2. The resistor 38 has a predetermined resistance R3.

In the D/A converter of FIG. 5, an analog output voltage VD which appears at the output terminal 26 is expressed as follows.

$$VD = \frac{R3(R+R1)}{R1R+(R1+R)(R2+R3)} \cdot Vcc - \quad (9)$$

$$\frac{R1R3}{R1R+(R1+R)(R2+R3)} \cdot IR \sum_{i=0}^{N} \left(\frac{1}{2}\right)^{N-1} \cdot Si$$

where Si denotes "0" or "1" represented by each of the bits of a digital input signal, and R denotes the resistance of each of resistors in an R-2R resistive ladder network 21.

Figure 6:
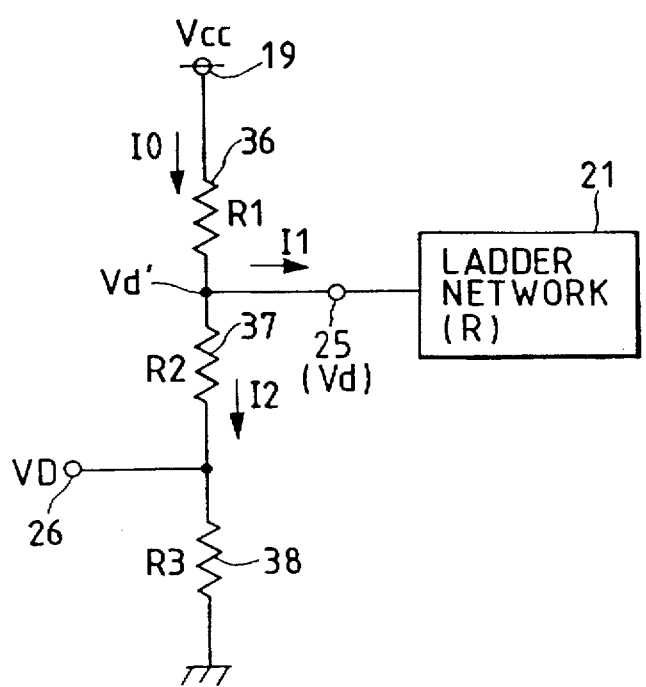
FIG. 6 is a diagram of a part of the D/A converter in FIG. 5.

With reference to FIG. 6, the resistance of a resistive ladder network 21 as viewed from the inter-network terminal 25 is equal to the given value R. If the resistive network 35 is not connected to the resistive ladder network 21, a voltage Vd appearing at the terminal 25 is equal to a value expressed in the equation (1). Accordingly, in the case where the resistive network 35 is connected to the resistive ladder network 21, the analog output voltage VD which appears at the output terminal 26 is given by referring to equations as follows.

$$VD = Vd' + I2R2 \quad (10)$$
$$Vd' = Vd + I1R \quad (11)$$
$$I1 + I2 = I0 \quad (12)$$

$$I2 = \frac{VD}{R3} \quad (13)$$

$$I0 = \frac{Vcc - Vd'}{R1} \quad (14)$$

where ¢I0" denotes the current flowing through the resistor 36; "I1" denotes the current flowing through the inter-network terminal 25; "I2" denotes the current flowing through the resistor 37; and "Vd'" denotes the voltage at the junction between the resistors 36 and 37.

Regarding the setting of a resolution and a range of the analog output voltage VD given by the equation (9), it is preferable to choose the resistances R1, R2, and R3 of the resistors 36, 37, and 38 by referring to the equations (9), (10), (11), (12), (13), and (14).

An example of the setting of the conditions is as follows. The power supply voltage Vcc is equal to 5 V. The analog output voltage VD is variable in the range of 4.5 V ±32 mV. The resolution corresponds to 2 mV. The resistance R is equal to 8 kΩ. The current value I is equal to 50 µA. The resistance R1 is equal to 800 Ω. The resistance R2 is equal to 4.4 kΩ. The resistance R3 is equal to 50 kΩ. In this case, the D/A converter of FIG. 5 is suitable to a 5-bit digital input signal rather than a 9-bit digital input signal. Thus, the D/A converter of FIG. 5 can handle a digital input signal having a reduced number of bits. This is advantageous in decreasing a chip size when the D/A converter of FIG. 5 is formed as an IC chip.

Confirmation is made as follows. The above-indicated values of the resistances R, R1, R2, and R3, the above-indicated value of the power supply voltage Vcc, and the above-indicated value of the current I are placed in the equation (9). Thereby, the equation (9) changes into the following version.

$$VD = 4.53496 - 0.03298 \cdot \sum_{i=0}^{N} \left(\frac{1}{2}\right)^{N-1} \cdot Si$$

This equation shows that the analog output voltage VD is variable in the range of 4.50301 V ±31.95 mV, and that the resolution corresponds to 2.061 mV (0.03298/24). These confirmation values of the range and the resolution are approximately equal to the previously-indicated setting values thereof.

It should be noted that the power supply terminal 19 and the ground may be exchanged with respect to a combination of the resistive ladder network 21, switches, and constant-current sources.

THIRD EMBODIMENT

Figure 7:
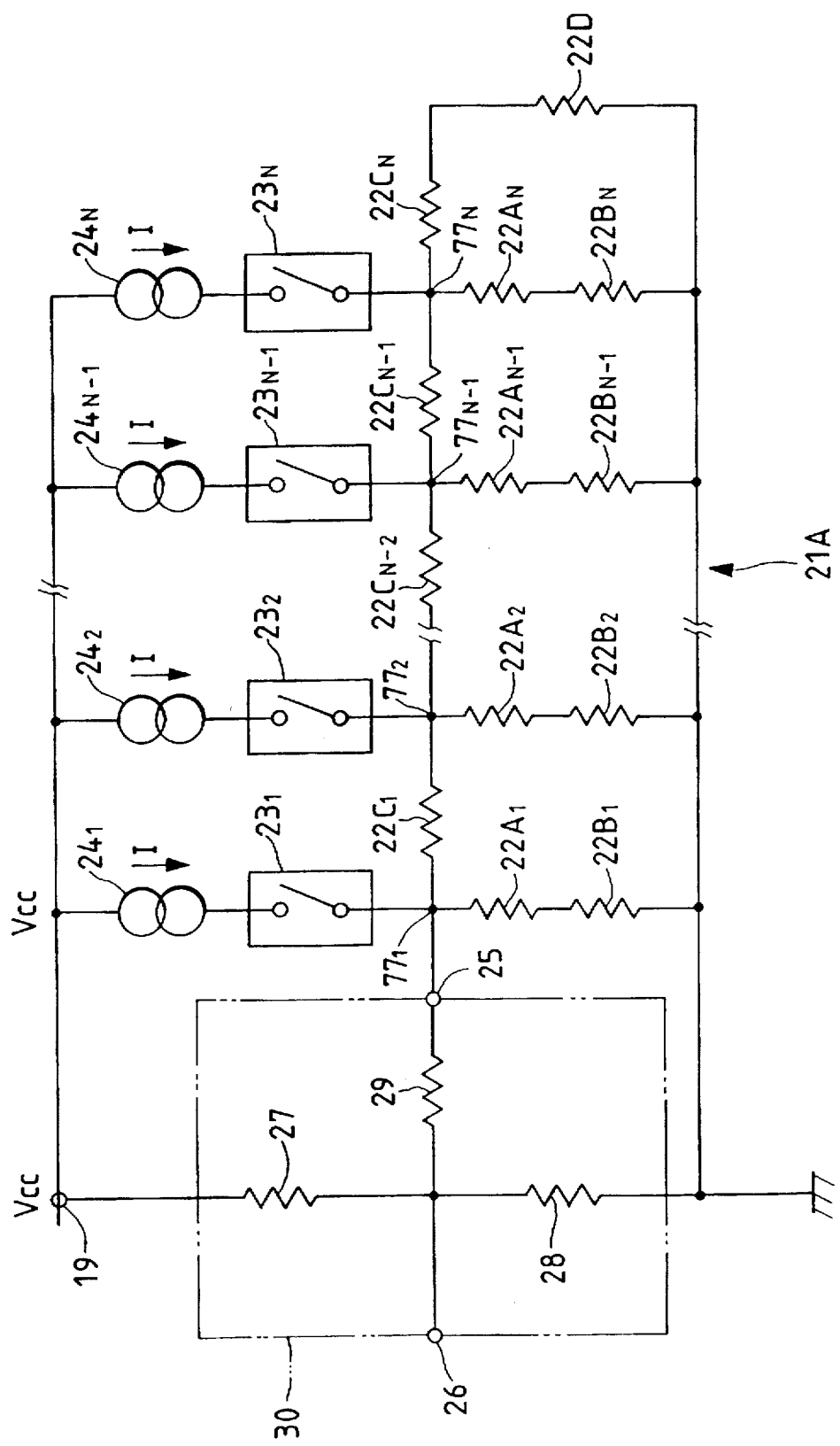
FIG. 7 is a diagram of a D/A converter according to a third embodiment of this invention.

FIG. 7 shows a D/A converter according to a third embodiment of this invention. The D/A converter of FIG. 7 is similar to the D/A converter of FIG. 2 except for design changes indicated later.

The D/A converter of FIG. 7 includes an R-2R resistive ladder network 21A. The resistive ladder network 21A has resistors $22A_1$, $22A_2$, ..., $22A_{N-1}$, $22A_N$, resistors $22B_1$, $22B_2$, ..., $22B_{N-1}$, $22B_N$, resistors $22C_1$, $22C_2$, ..., $22C_{N-1}$, $22C_N$, and a resistor 22D, where "N" denotes a given natural number. The resistors $22A_1$, $22A_2$, ..., $22A_{N-1}$, $22A_N$, the resistors $22B_1$, $22B_2$, ..., $22B_{N-1}$, $22B_N$, the resistors $22C_1$, $22C_2$, ..., $22C_{N-1}$, $22C_N$, and the resistor 22D are identical. Thus, the resistances of the resistors $22A_1$, $22A_2$, ..., $22A_{N-1}$, $22A_N$, the resistances of the resistors $22B_1$, $22B_2$, ..., $22B_{N-1}$, $22B_N$, the resistances of the resistors $22C_1$, $22C$, $22C_{N-1}$, $22C_N$, and the resistance of the resistor 22D are equal to a given value R.

The resistors $22A_1$ and $22B_1$ are connected in series. The resistors $22A_2$ and $22B_2$ are connected in series. Similarly, the resistors $22A_3$, $22A_4$, ..., $22A_{N-2}$, and the resistors $22B_3$, $22B_4$, ..., $22B_{N-2}$ are connected. The resistors $22A_{N-1}$ and $22B_{N-1}$ are connected in series. The resistors $22A_N$ and $22B_N$ are connected in series. First ends of the series combination of the resistors $22A_1$ and $22B_1$, the series combination of the resistors $22A_2$ and $22B_2$, ..., the series combination of the resistors $22A_{N-1}$ and $22B_{N-1}$, and the series combination of the resistors $22A_N$ and $22B_N$ are grounded in common. The resistors $22C_1$, $22C$, ..., $22C_{N-1}$ are sequentially connected between second ends of the series combination of the resistors $22A_1$ and $22B_1$, the series combination of the resistors $22A_2$ and $22B_2$, ..., the series combination of the resistors $22A_{N-1}$ and $22B_{N-1}$, and the series combination of the resistors $22A_N$ and $22B_N$. A first end of the resistor 22D is grounded. A second end of the resistor 22D is connected to a first end of the resistor $22C_N$. A second end of the resistor $22C_N$ is connected to the junction between the resistors $22A_N$ and the resistor $22C_{N-1}$.

The resistive ladder network 21 has nodes $77_1$, $77_2$, ..., $77_{N-1}$, and $77_N$ which are located at the junction between the resistors $22A_1$ and $22C_1$, the junction between the resistors $22A_2$ and $22C_1$, ..., the junction between the resistors $22A_{N-1}$ and $22C_{N-1}$, and the junction between the resistors $22A_N$ and $22C_N$, respectively. The first node $77_1$ is connected to an inter-network terminal 25. The first node $77_1$ is connected via a series combination of a switch $23_1$ and a constant-current source (a current regulator) $24_1$ to a power supply terminal 19 which leads from the positive terminal of a dc power supply (not shown). The dc power supply generates a given voltage Vcc equal to, for example, 5 V. The negative terminal of the dc power supply is grounded.

The second node $77_2$ is connected to the power supply terminal 19 via a series combination of a switch $23_2$ and a constant-current source (a current regulator) $24_3$. The third and later nodes $77_3$, $77_4$, ..., and $77_{N-2}$ are connected to the power supply terminal 19 via a series combination of a switch $23_3$ and a constant-current source (a current regulator) $24_3$, a series combination of a switch $23_4$ and a constant-current source (a current regulator) $24_4$, ..., and a series combination of a switch $23_{N-2}$ and a constant-current source (a current regulator) $24_{N-2}$, respectively. The node $77_{N-1}$ is connected to the power supply terminal 19 via a series combination of a switch $23_{N-1}$ and a constant-current source (a current regulator) $24_{N-1}$. The last node $77_N$ is connected to the power supply terminal 19 via a series combination of a switch $23_N$ and a constant-current source (a current regulator) $24_N$.

The switches $23_1$, $23_2$, , $23_{N-1}$, and $23_N$ have control terminals subjected to the bits of a digital input signal respectively.

The switches $23_1$, $23_2$, , $23_{N-1}$, and $23_N$ are sequentially assigned to the MSB (the highest bit) to the LSB (the lowest bit) of the digital input signal, respectively. Each of the switches $23_1$, $23_2$, . . . , $23_{N-1}$, and $23_N$ is changed between a closed state (an on state) and an open state (an off state) in response to the corresponding bit of the digital input signal.

The constant-current sources $24_1$, $24_2$, $23_{N-1}$, and $23_N$ are identical. Thus, the currents flowing through the respective constant-current sources $24_1$, $24_2$, $23_{N-1}$, and $23_N$ are equal to a given value I.

The D/A converter of FIG. 7 includes a resistive network 30 connected to the resistive ladder network 21A. The resistive network 30 has resistors 27, 28, and 29. A first end of the resistor 27 is connected to the power supply terminal 19. A first end of the resistor 28 is grounded. A first end of the resistor 29 is connected to the inter-network terminal 25. Second ends of the resistors 27, 28, and 29 are connected in com-mon to an output terminal 26. The resistor 27 has a predetermined-resistance R1. The resistor 28 has a predetermined resistance R2. The resistor 29 has a predetermined resistance R3.

FOURTH EMBODIMENT

Figure 8:
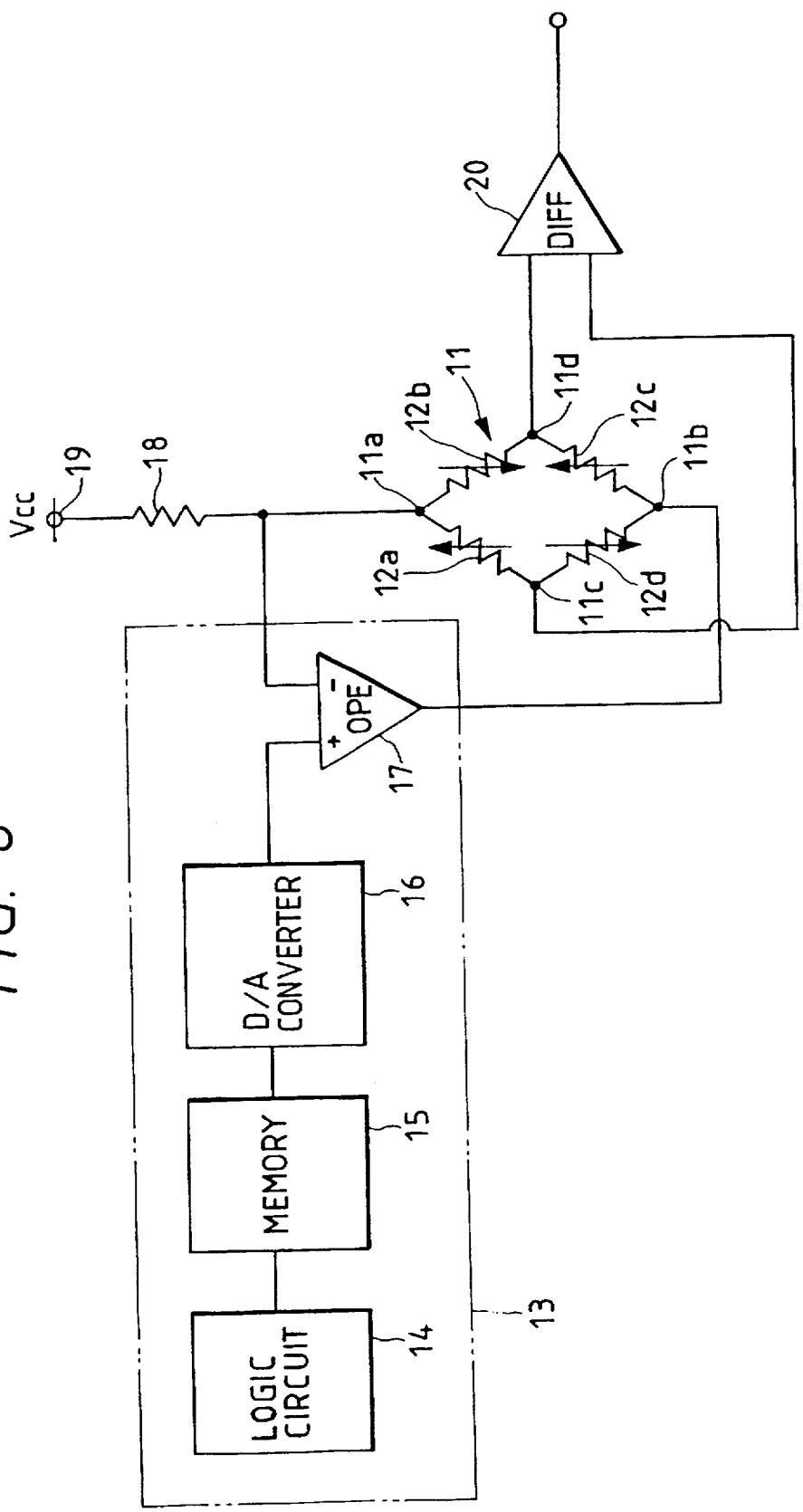
FIG. 8 is a diagram of a pressure sensor and a sensor-characteristic adjustment circuit according to a fourth embodiment of this invention.

With reference to FIG. 8, a pressure sensor 11 includes four resistive members 12a, 12b, 12c, and 12d provided in a semiconductor chip. The resistive members 12a, 12b, 12c, and 12d are electrically connected in a bridge. The resistances of the resistive members 12a, 12b, 12c, and 12d vary in response to a pressure applied to the sensor 11 so that the sensor 11 can generate and output a signal representing the applied pressure. The pressure sensor 11 has two input terminals 11a and 11b, and two output terminals 11c and 11d at the junctions among the resistive members 12a, 12b, 12c, and 12d. The input terminals 11a and 11b are used for feeding electric power to the pressure sensor 11. The output terminals 11c and 11d are used for the transmission of a sensor output signal.

A characteristic adjustment circuit 13 is electrically connected to the pressure sensor 11. The characteristic adjustment circuit 13 includes a logic circuit 14, a memory 15, a D/A converter 16, and an operational amplifier 17. The logic circuit 14 is connected to the memory 15. The logic circuit 14 sets digital data for adjustment of the characteristics of the pressure sensor 11. The logic circuit 14 stores the digital data into the memory 15. The memory 15 is connected to the D/A converter 16. The memory 15 feeds the digital data to the D/A converter 16 as a digital input signal. The D/A converter 16 uses the D/A converter of FIG. 2, the D/A converter of FIG. 5, or the D/A converter of FIG. 7. The D/A converter 16 changes the digital data (the digital input signal) into a corresponding analog voltage signal (an analog output signal).

The non-inverting input terminal of the operational amplifier 17 is connected to the output terminal of the D/A converter 16.

The inverting input terminal of the operational amplifier 17 is connected to the input terminal 11a of the pressure sensor 11. Also, the inverting input terminal of the operational amplifier 17 is connected via a resistor 18 to a dc power supply terminal 19 subjected to a given voltage Vcc. The output terminal of the operational amplifier 17 is connected to the input terminal 11b of the pressure sensor 11. The output terminals 11c and 11d of the pressure sensor 11 are connected to input terminals of a differential amplifier 20, respectively. The input terminal 11a of the pressure sensor 11 is connected to the power supply terminal 19 via the resistor 18. It is preferable that the characteristic adjustment circuit 13 is formed in a single IC chip.

In general, the electrical characteristics of pressure sensors vary from sensor to sensor. Characteristic adjustment work to compensate for such characteristic variations is implemented on each pressure sensor at a final stage of completing the pressure sensor as a product. During the characteristic adjustment work, the logic circuit 14 outputs reference digital data. The reference digital data is transmitted from the logic circuit 14 to the D/A converter 16 via the memory 15. The D/A converter 16 changes the reference digital data into a corresponding analog voltage, and outputs the analog voltage to the operational amplifier 17. The operational amplifier 17 generates and outputs a reference voltage signal which depends on the reference digital data. The reference voltage signal outputted from the operational amplifier 17 is applied between the input terminals 11a and 11b of the pressure sensor 11. The pressure sensor 11 generates a detection signal in response to the reference voltage signal. The detection signal is outputted from the output terminals 11c and 11d of the pressure sensor 11 to the differential amplifier 20. In the case where an output signal of the differential amplifier 20 meets given conditions, the reference digital data is used as final characteristic adjustment data. In the case where the output signal of the differential amplifier 20 does not meet the given conditions, the reference digital data is changed and then the steps of the characteristic adjustment work are repeated. These processes are iterated until the output signal of the differential amplifier 20 meets the given conditions. As previously described, when the output signal of the differential amplifier 20 meets the given conditions, the reference digital data is used as final characteristic adjustment data. The final characteristic adjustment data is stored into the memory 15.

During actual use of the pressure sensor 11 after the characteristic adjustment work is completed, the memory 15 feeds the final characteristic adjustment data to the D/A converter 16. The D/A converter 16 changes the final characteristic adjustment data into a corresponding analog voltage, and outputs the analog voltage to the operational amplifier 17. The operational amplifier 17 generates and outputs a corrective voltage signal which depends on the final characteristic adjustment data. The corrective voltage signal outputted from the operational amplifier 17 is applied to the pressure sensor 11. The corrective voltage signal compensates for a deviation of the characteristics of the pressure sensor 11 from desired characteristics (standard characteristics).

It should be noted that the pressure sensor 11 may be replaced by another sensor such as an acceleration sensor or a temperature sensor.

The D/A converter 16 which uses the D/A converter of FIG. 2, the D/A converter of FIG. 5, or the D/A converter of FIG. 7 is effective when the pressure sensor 11 is designed to sense a high pressure such as a fuel pressure in an internal combustion engine, a braking hydraulic pressure in an automotive vehicle, or a hydraulic pressure in an automatic transmission of an automotive vehicle.

In this case, the high pressure sensed by the pressure sensor 11 is generally in the range of 10 to 1,000 atm. A small size of the pressure sensor 11 is desirable for reliable detection of high pressures. A smaller size of the D/A converter 16 is desirable as a chip of the pressure sensor 11 is reduced in size. As previously indicated, the D/A converter of FIG. 2, the D/A converter of FIG. 5, and the D/A converter of FIG. 7 are suited to size reduction with respect to a given number of bits of a digital input signal.

The D/A converter 16 and the pressure sensor 11 may be integrated into a common sensor chip. It is now assumed that the D/A converter 16 and the pressure sensor 11 are integrated into a common sensor chip. In the case where the pressure sensor 11 is attached to an internal combustion engine, or in the case where the pressure sensor 11 is provided in an automatic transmission in an automotive vehicle, the sensor chip is exposed to a temperature of 100° or higher. In such a case, the sensor chip generally uses a silicon semiconductor substrate for a heat-resisting purpose. When a silicon semiconductor substrate is exposed to a high temperature, a leak current tends to flow through each pn junction formed on the silicon semiconductor substrate. Thus, leak currents tend to flow toward the silicon semiconductor substrate via transistors in switches and constant-current sources in the D/A converter 16. The leak currents reduce the resolution of the D/A converter 16.

Increases in the setting currents I determined by the constant-current sources in the D/A converter 16 decrease the affection of the leak currents. For adequate suppression of the affection of the leak currents, it is preferable that the setting currents I in the D/A converter 16 are equal to about 50 μA or greater. The D/A converter of FIG. 2, the D/A converter of FIG. 5, and the D/A converter of FIG. 7 meet such conditions of the setting currents I.

To suppress or prevent electromagnetic interference (EMI), it is desirable that the impedances at circuit points in the D/A converter 16 are relatively high. In the D/A converter of FIG. 2, the impedance of a circuit path from the power supply terminal 19 to the constant-current source is equal to, for example, about 6 kΩ. In the D/A converter of FIG. 5, the impedance of a circuit path from the power supply terminal 19 to the constant-current source is smaller than, for example, 1 kΩ. Accordingly, it appears that the D/A converter of FIG. 2 is better than the D/A converter of FIG. 5 in suppression of EMI.

Regarding the D/A converter of FIG. 5, more effective suppression of EMI is available as the resistance of the resistor 36 is increased. On the other hand, the setting currents I in the D/A converter of FIG. 5 decrease as the resistance of the resistor 36 is increased. Decreases in the setting currents I are negative factors with respect to suppression of the affection of the leak currents.

In the D/A converter of FIG. 2, the resistance 29 provides a higher impedance of a circuit path from the power supply terminal 19 to the constant-current source. This is advantageous in suppression of EMI. The resistance 29 allows a higher setting current I. This is advantageous in suppression of the affection of the leak currents.

What is claimed is:

1. A digital-to-analog converter comprising:

an R-2R resistive ladder network having resistors coupled in a ladder form in correspondence with a number of bits of a digital input signal, the R-2R resistive ladder network having an output terminal;

a positive and a negative dc-power-supply terminal both coupled to the R-2R resistive ladder network and the terminals subjected to first and second predetermined voltage references respectively, the first and second predetermined voltage references being different from each other;

means for controlling currents flowing between the R-2R resistive ladder network and one of the positive and negative dc-power-supply terminals in response to the bits of the digital input signal to generate an analog voltage signal at the output terminal of the R-2R resistive ladder network on the basis of the first and second predetermined voltage references, the analog voltage signal depending on the digital input signal;

a first resistor and a second resistor located outside the R-2R resistive ladder network and coupled in series between the positive and negative dc-power-supply terminals to receive the first and second predetermined voltage references;

a third resistor located outside the R-2R resistive ladder network and coupled between the output terminal of the R-2R resistive ladder network and the second resistor located outside the R-2R resistive ladder network; and a conversion output terminal coupled to a junction between the second and third resistors located outside the R-2R resistive ladder network.

2. A digital-to-analog converter as recited in claim 1, further comprising constant-current sources coupled between the R-2R resistive ladder network and one of the positive and negative dc-power-supply terminals.

3. The digital-to-analog converter of claim 1 which is operable at a temperature of 100° C. or higher and when exposed to electromagnetic interference.

4. A digital-to-analog converter comprising:

an R-2R resistive ladder network having resistors coupled in a ladder form in correspondence with a number of bits of a digital input signal, the R-2R resistive ladder network having an output terminal;

a positive and a and negative dc-power-supply terminal both coupled connected to the R-2R resistive ladder network and the terminals subjected to first and second predetermined voltage references respectively, the first and second predetermined voltage references being different from each other;

means for controlling currents flowing between the R-2R resistive ladder network and one of the positive and negative dc-power-supply terminals in response to the bits of the digital input signal to generate an analog voltage signal at the output terminal of the R-2R resistive ladder network on the basis of the first and second predetermined voltage references, the analog voltage signal depending on the digital input signal;

a series combination of a first resistor and a second resistor located outside the R-2R resistive ladder network, the series combination being coupled between the positive and negative dc-power-supply terminals to receive the first and second predetermined voltage references;

a third resistor located outside the R-2R resistive ladder network and coupled between the output terminal of the R-2R resistive ladder network and a junction between the first and second resistors located outside the R-2R resistive ladder network; and a conversion output terminal coupled to the junction between the first and second resistors located outside the R-2R resistive ladder network.

5. A digital-to-analog converter as recited in claim 4, wherein the controlling means comprises:

constant-current sources;

diodes coupled between the constant-current sources and the R-2R resistive ladder network; and means for controlling voltages at junctions between the constant-current sources and the diode in response to the bits of the digital input signal.

6. A digital-to-analog converter comprising:

an R-2R resistive ladder network having resistors connected in a ladder form in correspondence with a number of bits of a digital input signal, the R-2R resistive ladder network having an output terminal;

a positive and a negative dc-power-supply terminal both coupled to the R-2R resistive ladder network and the terminals subjected to first and second predetermined voltage references respectively, the first and second predetermined voltage references being different from each other;

means for controlling currents flowing between the R-2R resistive ladder network and one of the positive and negative dc-power-supply terminals in response to the bits of the digital input signal to generate an analog voltage signal at the output terminal of the R-2R resistive ladder network on the basis of the first and second predetermined voltage references, the analog voltage signal depending on the digital input signal;

a series combination of a first resistor, a second resistor, and a third resistor located outside the R-2R resistive ladder network, the series combination being coupled between the positive and negative dc-power-supply terminals to receive the first and second predetermined voltage references, wherein a junction between the first and second resistors located outside the R-2R resistive ladder network is coupled to the output terminal of the R-2R resistive ladder network; and a conversion output terminal coupled to a junction between the second and third resistors located outside the R-2R resistive ladder network.

7. A circuit for adjusting characteristics of a sensor, comprising:

a digital-to-analog converter converting a digital reference signal into an analog reference signal; and means for adjusting an output signal of the sensor in response to the analog reference signal generated by the digital-to-analog converter;

wherein the digital-to-analog converter comprises:

an R-2R resistive ladder network having resistors coupled in a ladder form in correspondence with a number of bits of the digital reference signal, the R-2R resistive ladder network having an output terminal;

a positive and a negative dc-power-supply terminal both coupled to the R-2R resistive ladder network and the terminals subjected to first and second predetermined voltage references respectively, the first and second predetermined voltage references being different from each other;

means for controlling currents flowing between the R-2R resistive ladder network and one of the positive and negative dc-power-supply terminals in response to the bits of the digital reference signal to generate an analog voltage signal at the output terminal of the R-2R resistive ladder network on the basis of the first and second predetermined voltage references, the analog voltage signal depending on the digital reference signal;

a first resistor and a second resistor located outside the R-2R resistive ladder network and coupled in series between the positive and negative dc-power-supply terminals to receive the first and second predetermined voltage references;

a third resistor located outside the R-2R resistive ladder network and coupled between the output terminal of the R-2R resistive ladder network and the second resistor located outside the R-2R resistive ladder network; and a conversion output terminal coupled to a junction between the second and third resistors located outside the R-2R resistive ladder network, the analog reference signal appearing at the conversion output terminal.

8. A circuit as recited in claim 7, further comprising a memory storing the digital reference signal.

* * * * *

UNITED STATES PATENT AND TRADEMARK OFFICE
CERTIFICATE OF CORRECTION

PATENT NO. : 5,781,141
DATED : July 14, 1998
INVENTOR(S) : IKUTA et al.

It is certified that error appears in the above-identified patent and that said Letters Patent is hereby corrected as shown below:

ON THE TITLE PAGE:

Item [56], please insert the following:

-- OTHER PUBLICATIONS

Hnalek, Eugene R. "D/A, A/D, Converter User Manual," Jul., 1982, portions of pp.93-95. "Training Course of Leture on Design of High Function Analog LSI", Kabushiki Kaisha Science Forum, Dec., 1992, portions of pp. 12-8.--

Signed and Sealed this

Twenty-second Day of December, 1998

Attest:

BRUCE LEHMAN

Attesting Officer    Commissioner of Patents and Trademarks